United States Patent [19]
Zheng et al.

[11] Patent Number: 5,948,700
[45] Date of Patent: *Sep. 7, 1999

[54] METHOD OF PLANARIZATION OF AN INTERMETAL DIELECTRIC LAYER USING CHEMICAL MECHANICAL POLISHING

[75] Inventors: Jia Zhen Zheng, Singapore, Singapore; Lap Chan, SF, Calif.

[73] Assignee: Chartered Semiconductor Manufacturing Ltd., Singapore, Singapore

[*] Notice: This patent issued on a continued prosecution application filed under 37 CFR 1.53(d), and is subject to the twenty year patent term provisions of 35 U.S.C. 154(a)(2).

[21] Appl. No.: 08/650,694

[22] Filed: May 20, 1996

[51] Int. Cl.$^6$ .................................................. H01L 21/306
[52] U.S. Cl. .......................... 438/694; 438/692; 438/13; 438/17; 438/761; 438/763; 438/778; 438/782; 438/788; 216/86; 216/89
[58] Field of Search .................................. 438/13, 17, 692, 438/694, 761, 763, 778, 788, 782, 622; 216/86, 89

[56] References Cited

U.S. PATENT DOCUMENTS

| | | | |
|---|---|---|---|
| 4,956,313 | 9/1990 | Cote et al. | 216/18 |
| 4,997,789 | 3/1991 | Keller et al. | 438/643 |
| 5,069,002 | 12/1991 | Sandhu et al. | 451/1 |
| 5,094,972 | 3/1992 | Pierce et al. | 438/427 |
| 5,244,534 | 9/1993 | Yu et al. | 438/672 |
| 5,262,354 | 11/1993 | Cote et al. | 216/18 |
| 5,275,963 | 1/1994 | Cederbaum et al. | 438/624 |
| 5,312,512 | 5/1994 | Allman et al. | 438/624 |
| 5,354,712 | 10/1994 | Ho et al. | 438/643 |
| 5,472,825 | 12/1995 | Sayka | 430/311 |
| 5,532,191 | 7/1996 | Nakano et al. | 438/692 |
| 5,554,555 | 9/1996 | Rostoker et al. | 438/14 |

*Primary Examiner*—Bernard Codd
*Attorney, Agent, or Firm*—George O. Saile; Rosemary L.S. Pike; Larry J. Prescott

[57] ABSTRACT

A method of planarizing integrated circuit wafers using chemical mechanical polishing with an automatic end point and without using an etchback step. An electrode pattern is formed in a layer of soft metal, such as Al/Cu/Si, capped with a layer of hard metal such as tungsten. A layer of first oxide, a layer of spin on glass, and a layer of second oxide are formed over the electrode pattern. The layer of first oxide, the layer of spin on glass, and the layer of second oxide are then planarized using chemical mechanical polishing. The hard metal cap on the electrode pattern can not be removed by the chemical mechanical polishing and forms an automatic end point. The electric current powering the motor driving the chemical mechanical polishing changes when the hard metal cap is reached and this change can be used to detect the end point.

22 Claims, 4 Drawing Sheets

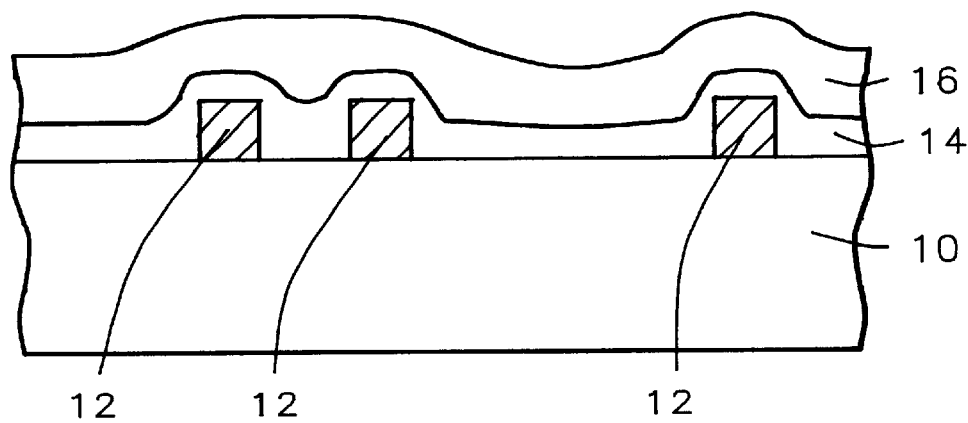
FIG. 1A – Prior Art
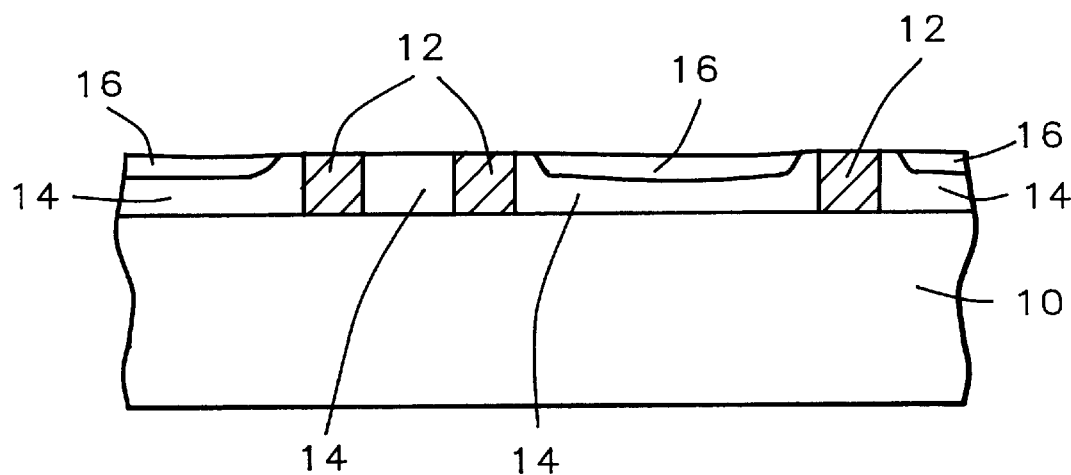
FIG. 1B – Prior Art

METHOD OF PLANARIZATION OF AN INTERMETAL DIELECTRIC LAYER USING CHEMICAL MECHANICAL POLISHING

BACKGROUND OF THE INVENTION (1) Field of the Invention

This invention relates to the planarization of an intermetal dielectric layer comprising spin on glass and more particularly to planarization using chemical mechanical polishing without etchback and having an automatic end point.

(2) Description of the Related Art

U.S. Pat. No. 5,094,972 to Pierce et al. describes the formation of a stop layer of CVD silicon nitride or CVD carbon on the surface of an integrated circuit wafer. Holes are formed in the stop layer and wells are formed in the material below the openings. After processing the device is planarized to the stop layer using abrasive mechanical polishing.

U.S. Pat. No. 4,956,313 to Cote et al. describes forming an insulator layer with holes. The holes are then filled with CVD tungsten which is also formed on the insulator layer. The metal layer and the insulator layer are then subjected to a polish etch in the presence of an abrasive slurry to remove the metal not filling the holes and to planarize the insulator layer.

U.S. Pat. No. 5,472,825 to Sayka describes planarizing a spin on glass layer without the use of a stop layer.

U.S. Pat. No. 4,997,789 to Keller et al. describes planarization using etchback with an aluminum etch stop layer.

U.S. Pat. No. 5,275,963 to Cedarbaum et al. describes planarizing a layer of phosphosilicate glass using chemical mechanical polishing without a stop layer.

This invention describes using chemical mechanical polishing to planarize an intermetal dielectric without using an etchback step. A hard metal cap formed on an electrode pattern is used as a stop for the chemical mechanical polishing step.

SUMMARY OF THE INVENTION

Intermetal dielectric is used to separate levels of metal electrodes in integrated circuit wafers. For dense integrated circuit structures the intermetal dielectric has a very irregular top surface and must be planarized before the next level of metal electrodes can be formed. Spin on glass, SOG, is often used to fill the narrow gaps between the electrodes.

A conventional method of forming and planarizing the intermetal dielectric, IMD, is shown in FIGS. 1A and 1B. FIG. 1A shows an integrated circuit wafer 10 with devices formed therein, not shown. A dielectric layer, not shown, may or may not be formed directly over the integrated circuit wafer 10. Metal electrodes 12 are formed on the integrated circuit wafer using blanket deposition of metal and well known photolithographic techniques. A layer of spin on glass 14 is then formed on the integrated circuit wafer 10 filling the gaps between the electrodes 12 but having a very irregular surface. The layer of spin on glass is then etched back and a layer of oxide 16 is formed on the etched back layer of spin on glass.

As shown in FIG. 1B the intermetal dielectric is then planarized using chemical mechanical polishing to remove that part of the layer of oxide 16 and that part of the layer of spin on glass 14 which is above the plane formed by the top surface of the electrodes 12. During the chemical mechanical polishing step the tops of the metal electrodes are exposed. Another layer of oxide or other dielectric, not shown, can then be formed on the intermetal dielectric layer and another layer of metal electrodes can be formed, not shown.

Some of the disadvantages of the conventional method of planarization just described are the cost of the etch back step and the determination of the end point of the chemical mechanical polishing, or CMP, step. If the CMP step is continued too long part of the metal electrodes will be polished away. If the CMP step is stopped too soon there will be dielectric material left over the top of the electrodes.

It is an objective of this invention to provide a method of planarization of an intermetal dielectric which does not require an etch back step and uses a chemical mechanical polishing step which has an automatic end point determination.

This objective is achieved by forming a hard metal cap, such as tungsten, on the soft metal electrodes. The intermetal dielectric is then formed over the electrodes formed of the normal soft metal with a hard metal cap. The intermetal dielectric is then planarized using CMP with an oxide slurry. The hard metal cap will not be polished away by the CMP step and will form an automatic end point to the CMP step. The hard metal cap will not be scratched, corroded, or smeared by the CMP step. Monitoring the current of the motor driving the CMP will provide good endpoint determination since the load on the motor will change significantly when the hard metal cap is reached.

BRIEF DESCRIPTION OF THE DRAWINGS

FIG. 1A shows a cross section view of an integrated circuit wafer being planarized using a conventional method after etchback of the spin on glass and formation of the oxide layer and prior to the chemical mechanical polishing.

FIG. 1B shows a cross section view of an integrated circuit wafer being planarized using a conventional method after completion of the chemical mechanical polishing.

DESCRIPTION OF THE PREFERRED EMBODIMENTS

Figure 2:
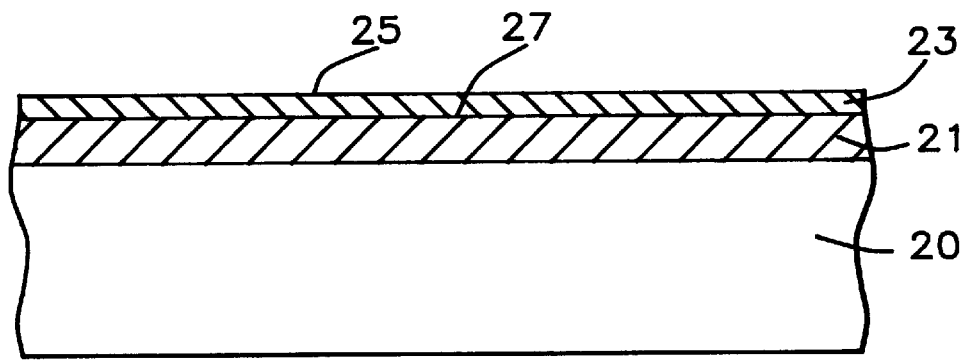
FIG. 2 shows a cross section view of an integrated circuit wafer with a layer of soft metal formed on the integrated circuit wafer and a layer of hard metal formed on the layer of soft metal.

Refer now to FIGS. 2–7, there is shown an embodiment of the planarization method of this invention. FIG. 2 shows an integrated circuit wafer 20 with devices formed therein, not shown, and a dielectric layer formed thereon, not shown. A layer of first metal 21, such as Al/Cu/Si, Al/Cu, or the like, having a thickness of between about 3000 and 10,000 Angstroms is formed on the integrated circuit wafer. The first metal is typically soft and would be easily polished away during a chemical mechanical polishing step. Next a layer of second metal 23, such as tungsten, tungsten nitride, titanium nitride, or the like having a first surface 25, a second surface 27, and a thickness of between about 200 and 2000 Angstroms, is formed on the layer of first metal 21. The second surface 27 of the layer of second metal 23 contacts the layer of first metal 21. The first surface 25 of the layer of second metal 23 forms a first plane wherein the integrated circuit wafer 20, the layer of first metal 21, and the layer of second metal 23 are below the first plane. The second metal is sufficiently hard, having a Knoop hardness value equal to or greater than 485 kg/nm$^2$, that the second metal will resist being polished away by the chemical mechanical polishing step.

Figure 3:
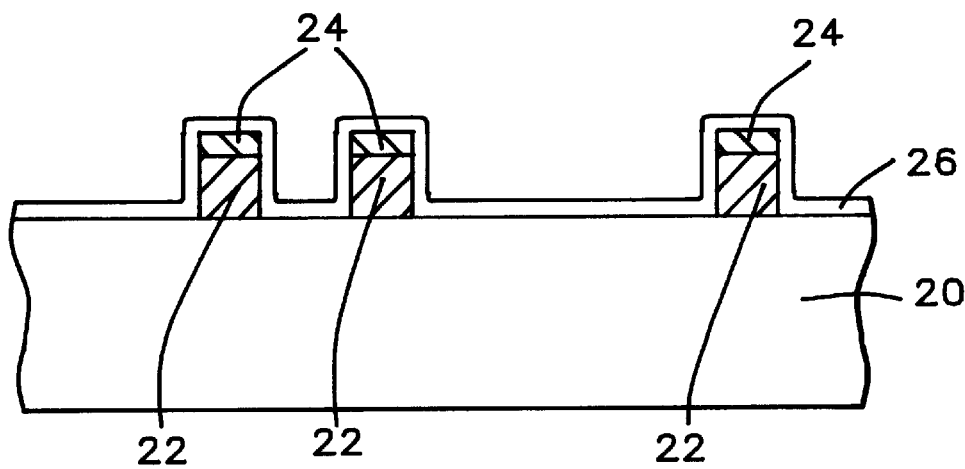
FIG. 3 shows a cross section view of an integrated circuit wafer with an electrode pattern formed in the layer of soft metal and the layer of hard metal. A layer of first oxide is formed on the wafer covering the electrode pattern.
Figure 4:
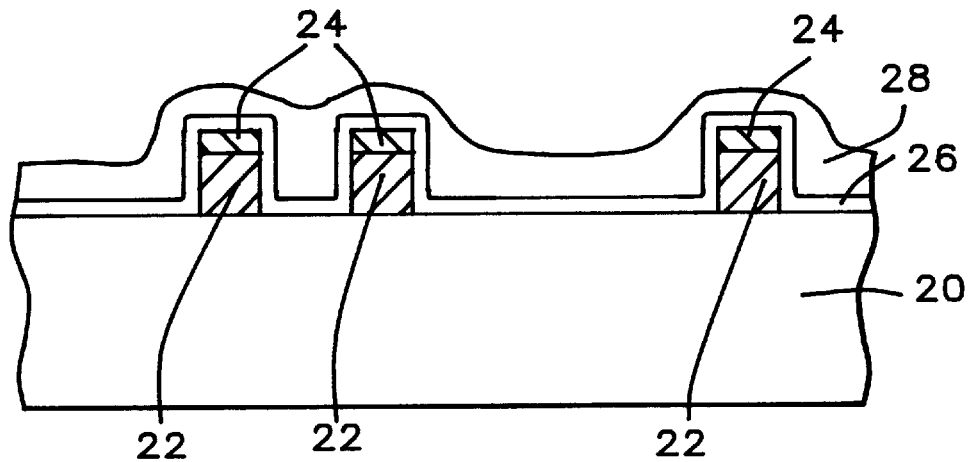
FIG. 4 shows a cross section view of an integrated circuit wafer with an electrode pattern formed in the layer of soft metal and the layer of hard metal, a layer of first oxide formed on the wafer covering the electrode pattern, and a layer of spin on glass formed on the layer of first oxide.

Next as shown in FIG. 3 a first pattern is formed in the layer of first metal 22 and the same first pattern is formed in the layer of second metal 24. A layer of first oxide 26, having a thickness of between about 500 and 6000 Angstroms, is then formed on the integrated circuit wafer 20 by means of chemical vapor deposition covering the first pattern formed of the first metal 22 and the second metal 24. As shown in FIG. 4 a layer of spin on glass 28, having a thickness of between about 2000 and 8000 Angstroms, is then formed on the layer of first oxide 26. The layer of spin on glass is then baked at a temperature of between about 150° C. and 300° C. for between about 0.5 and 5 minutes and cured at a temperature of between about 350° C. and 500° C. for between about 30 and 240 minutes.

Figure 5:
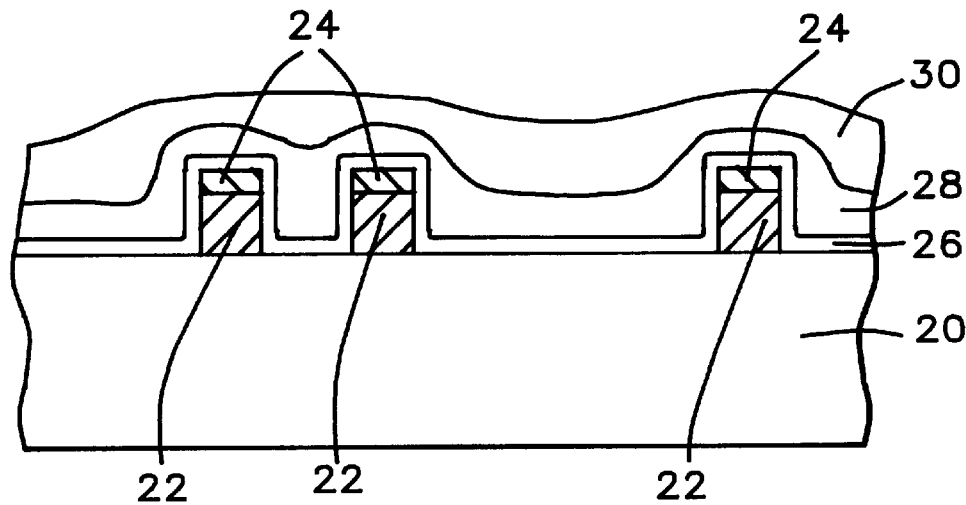
FIG. 5 shows a cross section view of an integrated circuit wafer with an electrode pattern formed in the layer of soft metal and the layer of hard metal, a layer of first oxide formed on the wafer covering the electrode pattern, a layer of spin on glass formed on the layer of first oxide, and a layer of second oxide formed on the layer of first oxide.

Next, as shown in FIG. 5, a layer of second oxide 30 having a high density and a thickness of between about 3000 and 20,000 Angstroms is formed over the cured layer of spin on glass 28 using plasma assisted chemical vapor deposition. The layer of first oxide 26, the layer of spin on glass 28, and the layer of second oxide 30 make up a first dielectric. Part of the layer of first oxide 26, part of the layer of spin on glass 28, and part of the layer of second oxide 30 are above the first plane defined by the first surface of the layer of second metal.

Figure 6:
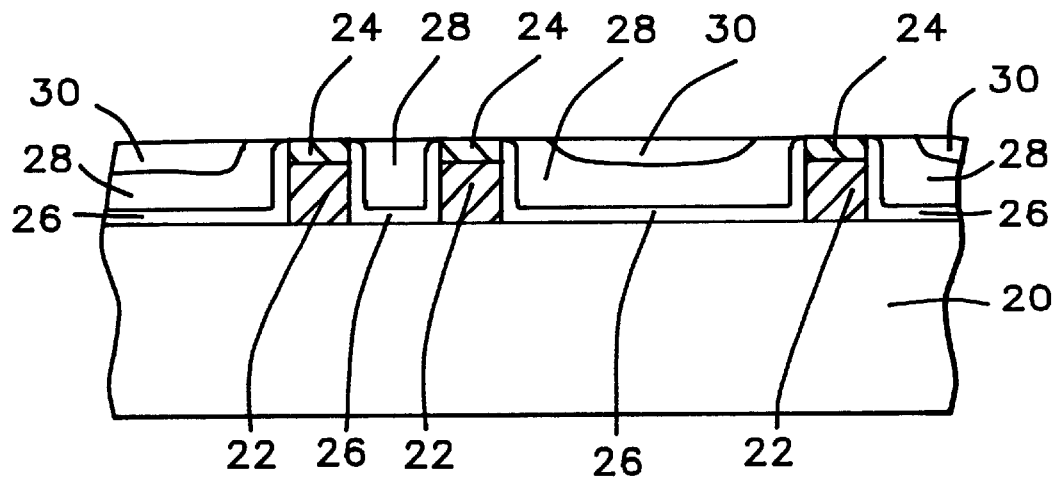
FIG. 6 shows a cross section view of an integrated circuit wafer with the intermetal dielectric planarized using chemical mechanical polishing.

Next, as shown in FIG. 6, the first dielectric is planarized using chemical mechanical polishing using an oxide slurry, such as colloidal silica. That part of the layer of first oxide 26 above the first plane, that part of the layer of spin on glass 28 above the first plane, and that part of the layer of second oxide 30 above the first plane are removed by the chemical mechanical polishing, or CMP. When the CMP reaches the first pattern formed in the second metal 24 the CMP is unable to remove the hard second metal. The hard second metal stops the progress of the CMP at the first plane. In this way the first pattern formed in the hard second metal 24 provides an automatic end point to the CMP step.

The CMP step is driven by an electric motor powered by an electric current. When the CMP reaches the hard second metal the load on the motor will change significantly and will cause and increase of the electric current powering the CMP step. By monitoring this electric current the endpoint of the CMP step can be easily and accurately determined.

Figure 7:
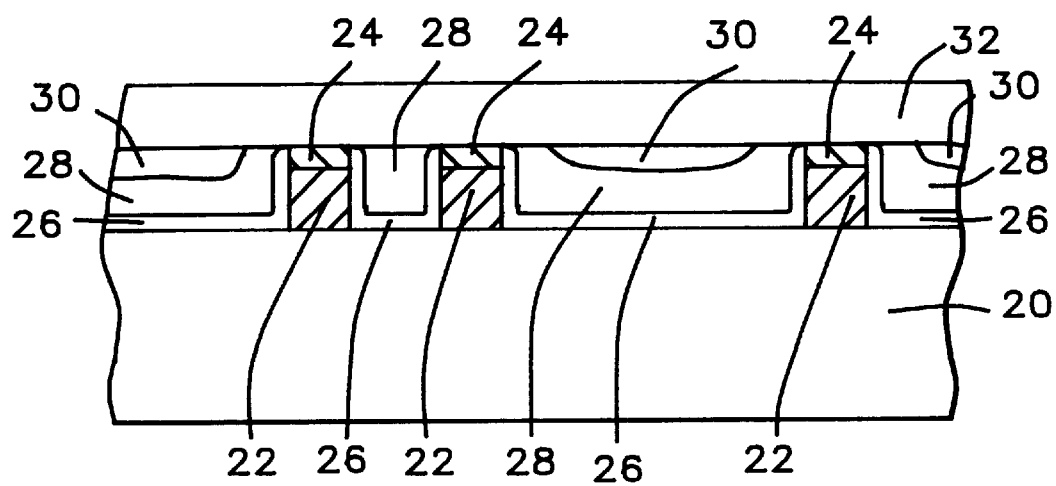
FIG. 7 shows a cross section view of an integrated circuit wafer after planarization of the intermetal dielectric with a layer of third oxide formed on the planarized intermetal dielectric.

As shown in FIG. 6, that part of the layer of first oxide 26 below the first plane, that part of the layer of spin on glass 28 below the first plane, and that part of the layer of second oxide 30 below the first plane remain after the chemical mechanical polishing, or CMP, has been completed. Next, as shown in FIG. 7, a layer of third oxide 32 is formed over the planarized first dielectric and processing of the integrated circuit wafer proceeds in a conventional manner.

While the invention has been particularly shown and described with reference to the preferred embodiments thereof, it will be understood by those skilled in the art that various changes in form and details may be made without departing from the spirit and scope of the invention.

What is claimed is:

1. A method of planarization, comprising the steps of:
   providing an integrated circuit wafer with devices formed therein;
   forming a layer of first metal on said integrated circuit wafer;
   forming a layer of second metal, having a first surface and a second surface, on said layer of first metal wherein said second metal has a Knoop hardness value equal to or greater than 485 kg/nm$^2$, said second surface of said layer of said second metal contacts said layer of first metal, and said first surface of said layer of said second metal forms a first plane wherein said layer of said second metal and said layer of first metal are below said first plane;
   forming a first pattern in said layer of first metal and said layer of second metal;
   forming a layer of first dielectric on said integrated circuit wafer covering said first pattern formed in said layer of first metal and said layer of second metal, wherein part of said layer of first dielectric is above said first plane;
   removing that part of said layer of first dielectric above said first plane using chemical mechanical polishing, thereby planarizing said layer of first dielectric, wherein said chemical mechanical polishing continues until stopped by said first pattern formed in said layer of second metal;
   cleaning said layer of first dielectric; and
   forming a layer of second dielectric on said planarized layer of first dielectric.

2. The method of claim 1 wherein forming said layer of first dielectric comprises the steps of:
   forming a layer of first oxide on said integrated circuit wafer covering said first pattern formed in said layer of first metal and said layer of second metal, wherein part of said layer of first oxide is above said first plane;
   forming a layer of spin on glass on said layer of first oxide, wherein part of said layer of spin on glass is above said first plane;
   curing said layer of spin on glass; and
   forming a layer of second oxide on said layer of spin on glass, wherein part of said layer of second oxide is above said first plane.

3. The method of claim 2 wherein said layer of first oxide has a thickness of between about 500 and 6000 Angstroms and is formed using chemical vapor deposition.

4. The method of claim 2 wherein said layer of spin on glass has a thickness of between about 2000 and 8000 Angstroms.

5. The method of claim 2 wherein said layer of second oxide has a thickness of between about 3000 and 20,000 Angstroms and is formed using plasma assisted chemical vapor deposition.

6. The method of claim 1 wherein said first metal is Aluminum/Silicon/Copper having a thickness of between about 3000 and 10,000 Angstroms.

7. The method of claim 1 wherein said first metal is Aluminum/Copper having a thickness of between about 3000 and 10,000 Angstroms.

8. The method of claim 1 wherein said second metal is Tungsten having a thickness of between about 200 and 2000 Angstroms.

9. The method of claim 1 wherein said second metal is Tungsten Nitride having a thickness of between about 200 and 2000 Angstroms.

10. The method of claim 1 wherein said second metal is Titanium Nitride having a thickness of between about 200 and 2000 Angstroms.

11. The method of claim 1 wherein said chemical mechanical polishing uses an oxide slurry.

12. A method of planarization, comprising the steps of:
   providing an integrated circuit wafer with devices formed therein;
   forming a layer of first metal on said integrated circuit wafer;
   forming a layer of second metal, having a first surface and a second surface, on said layer of first metal wherein said second metal has a Knoop hardness value equal to or greater than 485 kg/nm$^2$, said second surface of said layer of said second metal contacts said layer of first metal, and said first surface of said layer of said second metal forms a first plane wherein said layer of said second metal and said layer of first metal are below said first plane;
   forming a first pattern in said layer of first metal and said layer of second metal;
   forming a layer of first dielectric on said integrated circuit wafer covering said first pattern formed in said layer of first metal and said layer of second metal, wherein part of said layer of first dielectric is above said first plane;
   removing that part of said layer of first dielectric above said first plane using chemical mechanical polishing, thereby planarizing said layer of first dielectric, wherein said chemical mechanical polishing uses an electric motor powered by an electric current, said chemical mechanical polishing is continued until an endpoint is reached, and said endpoint is determined by monitoring said electric current;
   cleaning said planarized layer of first dielectric; and
   forming a layer of second dielectric on said planarized layer of first dielectric.

13. The method of claim 12 wherein forming said layer of first dielectric comprises the steps of:
   forming a layer of first oxide on said integrated circuit wafer covering said first pattern formed in said layer of first metal and said layer of second metal, wherein part of said layer of first oxide is above said first plane;
   forming a layer of spin on glass on said layer of first oxide, wherein part of said layer of spin on glass is above said first plane;
   curing said layer of spin on glass; and
   forming a layer of second oxide on said layer of spin on glass, wherein part of said layer of second oxide is above said first plane.

14. The method of claim 13 wherein said layer of first oxide has a thickness of between about 500 and 6000 Angstroms and is formed using chemical vapor deposition.

15. The method of claim 13 wherein said layer of spin on glass has a thickness of between about 2000 and 8000 Angstroms.

16. The method of claim 13 wherein said layer of second oxide has a thickness of between about 3000 and 20,000 Angstroms and is formed using plasma assisted chemical vapor deposition.

17. The method of claim 12 wherein said first metal is Aluminum/Silicon/Copper having a thickness of between about 3000 and 10,000 Angstroms.

18. The method of claim 12 wherein said first metal is Aluminum/Copper having a thickness of between about 3000 and 10,000 Angstroms.

19. The method of claim 12 wherein said second metal is Tungsten having a thickness of between about 200 and 2000 Angstroms.

20. The method of claim 12 wherein said second metal is Tungsten Nitride having a thickness of between about 200 and 2000 Angstroms.

21. The method of claim 12 wherein said second metal is Titanium Nitride having a thickness of between about 200 and 2000 Angstroms.

22. The method of claim 12 wherein said chemical mechanical polishing uses an oxide slurry.

* * * * *